United States Patent
Park et al.

(10) Patent No.: US 6,458,693 B1
(45) Date of Patent: Oct. 1, 2002

(54) METHOD OF MANUFACTURING A SEMICONDUCTOR DEVICE

(75) Inventors: Sang Wook Park, Seoul; Min Sik Jang, Chollanam-do, both of (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/328,694

(22) Filed: Jun. 9, 1999

(30) Foreign Application Priority Data

Jun. 3, 1998 (KR) ............................................ 98-25778

(51) Int. Cl.[7] .............................................. H01L 21/44
(52) U.S. Cl. ...................... 438/652; 438/558; 438/559; 438/560; 438/561; 438/564; 438/592; 438/656; 438/657; 438/660; 438/663; 438/664; 438/669
(58) Field of Search ................................ 438/657, 656, 438/683, 592, 655, 558, 564, 559, 560, 561, 660, 663, 664, 669

(56) References Cited

U.S. PATENT DOCUMENTS

| | | | |
|---|---|---|---|
| 4,505,027 A | 3/1985 | Schwabe et al. ............... 29/577 |
| 4,992,388 A | 2/1991 | Pfiester ......................... 437/41 |
| 5,285,088 A | 2/1994 | Sato et al. .................... 257/192 |
| 5,364,810 A | 11/1994 | Kosa et al. ................... 437/52 |
| 5,543,350 A | 8/1996 | Chi et al. ...................... 437/60 |
| 5,635,765 A | * 6/1997 | Larson ......................... 257/768 |
| 5,877,074 A | * 3/1999 | Jeng et al. .................... 438/592 |
| 5,899,735 A | * 5/1999 | Tseng .......................... 438/592 |
| 6,051,466 A | * 4/2000 | Iwasa ........................... 438/259 |
| 6,100,192 A | * 8/2000 | Morales et al. .............. 438/682 |
| 6,103,606 A | * 8/2000 | Wu et al. ..................... 438/586 |
| 6,284,633 B1 | * 9/2001 | Nagabushnam et al. .... 438/585 |

* cited by examiner

Primary Examiner—Wael Fahmy
Assistant Examiner—Julio J. Maldonado
(74) Attorney, Agent, or Firm—Ladas & Parry

(57) ABSTRACT

A semiconductor device which can reduce contact resistance, is disclosed. A semiconductor device according to the present invention includes a lower conductor pattern and an upper conductor pattern. The lower conductor pattern is in contact with the upper conductor pattern. The lower conductor pattern includes a first doped polysilicon layer, a first tungsten silicide layer and a cap layer formed sequentially. Here, the cap layer is formed to a doped polysilicon layer containing a small amount of tungsten and has stoichiometrical equivalent ratio x of Si higher than the first tungsten silicide layer. The upper conductor pattern includes a second doped polysilicon layer and a second tungsten layer formed sequentially. The contact of lower conductor pattern and the upper conductor pattern is substantially formed between the cap layer and the second doped polysilicon layer. Preferably, stoichiometrical equivalent ratio x of Si for the first tungsten silicide layer is 2.3 to 2.5 and stoichiometrical equivalent ratio x of Si for the cap layer is 2.6 to 2.9.

12 Claims, 2 Drawing Sheets

METHOD OF MANUFACTURING A SEMICONDUCTOR DEVICE

BACKGROUND OF THE INVENTION

1. Field of the Invention

The present invention relates to a semiconductor device and a method of manufacturing the same, and more particularly to a contact structure of a semiconductor device and a method of forming the same.

2. Description of the Related Art

In a semiconductor memory device, a cell selection signal is applied to a word line and a data signal is applied to a bit line, so that the data signal is applied to the selected cell. The bit line is in contact with the word line in the periphery region of the memory device. The word line and the bit line are formed to materials having good conductivity, for preventing signal delay. For example, they are generally formed to a tungsten polycide structure in which a tungsten silicide layer is formed on a doped polysilicon layer.

FIG. 1 shows a conventional contact structure between a word line and a bit line in the periphery region of a memory device.

Referring to FIG. 1, a word line 12 in which a first tungsten silicide ($WSi_x$) layer 12a is formed on a first doped polysilicon layer (doped ploy-Si) 12a is formed on a semiconductor substrate 10. An intermediate insulating layer 14 is then formed on the overall substrate and etched to expose the portion of the surface of the first tungsten silicide layer 12b of the word line 12, thereby forming a contact hole 16. Thereafter, a bit line 18 in which a second tungsten silicide layer 18b is formed on a second doped polysilicon 18a is formed on the surface of the contact hole 16 and on the intermediate insulating layer 14, to be contact with the word line 12 through the contact hole 16.

However, there are following problems in the contact structure of the word line 12 and the bit line 18 above described.

Firstly, owing to heterojunction of the second doped polysilicon layer 18a and the first tungsten silicide layer 12b at the contact portion, barrier height of about 0.65 eV. due to the difference of work functions φpoly and φwsix between the two layers 18a and 12b exist, as shown in FIG. 2. Tunneling current therefore decreases when electrons are therefore migrate, thereby increasing contact resistance between the word line and the bit line.

Secondly, when performing etching for forming the contact, owing to sputtering yield difference and reaction difference of W and Si for plasma gas such as $C_xF_y$, $CF_4+O_2$, $CH_xF_y$, and $CH_xBr_y$, is used as etching gas, the exposed surface of the first tungsten silicide layer 12b is rouged, so that contact resistance between the word line 12 and the bit line 18 further increases and contact interface therebetween is unstablized.

Thirdly, the plasma gas reacts with W and/or Si of the first tungsten silicide layer 12b, so that insulating compounds 100 having negative ΔH as shown in TABLE 1 are created on the exposed surface of the first tungsten silicide layer 12b, and acts as factor increasing the contact resistance. As a result, signal delay time increases.

TABLE 1

| processing productions | Δ H (KJ/mole) |
|---|---|
| WC, SiC | −20.5 |
| $SiO_2$ | −17 |
| WNx | −12.6 |
| $W_2N$ | −72 |
| $WO_2$ | −533 |
| $WO_3$ | −843 |

SUMMARY OF THE INVENTION

It is therefore one object of the present invention to provide a semiconductor device which can reduce contact resistance by decreasing the difference of the work functions in contact, for solving the problems in the conventional art.

Furthermore, it is another object of the present invention to provide a method of manufacturing a semiconductor device which can reduce contact resistance.

To accomplish one object of the present invention, a semiconductor device according to the present invention includes a lower conductor pattern and an upper conductor pattern. The lower conductor pattern is in contact with the upper conductor pattern. The lower conductor pattern includes a first doped polysilicon layer, a first tungsten silicide layer and a cap layer formed sequentially. Here, the cap layer is formed to a doped polysilicon layer containing a small amount of tungsten and having stoichiometrical equivalent ratio x of Si higher than the first tungsten silicide layer. The upper conductor pattern includes a second doped polysilicon layer and a second tungsten layer formed sequentially. The contact of the lower conductor pattern and the upper conductor pattern is substantially formed between the cap layer and the second doped polysilicon layer.

Preferably, stoichiometrical equivalent ratio x of Si for the first tungsten silicide layer is 2.3 to 2.5 and stoichiometrical equivalent ratio x of Si for the cap layer is 2.6 to 2.9.

Furthermore, to accomplish another object of the present invention, according to the present invention, firstly, a first doped polysilicon layer and a first tungsten silicide layer on a semiconductor substrate are formed, sequentially. A cap layer is then formed on the first tungsten silicide layer by in-situ after forming the first tungsten silicide layer. Here, the cap layer is formed to an undoped polysilicon layer containing a small amount of tungsten and having stoichiometrical equivalent ratio x of Si higher than the first tungsten silicide layer. Next, the cap layer, the first tungsten silicide layer and the first doped polysilicon layer are patterned to form a lower conductor pattern. An intermediate insulating layer is formed on the overall substrate and etched to expose a portion of the surface to the cap layer, thereby forming a contact hole. Thereafter, a second doped polysilicon layer and a second tungsten silicide layer are formed on the surface of the contact hole and on the intermediate insulating layer, sequentially and patterned to form an upper conductor pattern being in contact with the lower conductor pattern. Next, the substrate in which the upper conductor pattern is formed is annealed, to outdiffuse impurities of the second doped polysilicon layer into the cap layer, thereby doping the cap layer.

In this embodiment, the first tungsten silicide layer is formed by CVD using $SiH_2Cl_2$ (or $SiH_4$) gas and $WF_6$ gas as reactive gases at the temperature of 550 to 600° C. Preferably, the ratio of $SiH_2Cl_2$ (or $SiH_4$):$WF_6$ is 8:1.5 to 10:2 and stoichiometrical equivalent ratio x for Si of the first tungsten silicide layer is 2.3 to 2.5.

Furthermore, the cap layer is formed by depositing a undoped polysilicon layer by in-situ after forming the first tungsten silicide layer using $SiH_2Cl_2$ (or $SiH_4$) gas and $WF_6$. Preferably, the ratio of $SiH_2Cl_2$ (or $SiH_4$) $WF_6$ to 9:0.8 to 11:1.2 and the stoichiometrical equivalent ratio x for Si of the cap layer is 2.6 to 2.9.

Moreover, the annealing is preformed at the temperature of 600 to 900° C.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained in more detail with reference to accompanying drawings.

Figure 1:
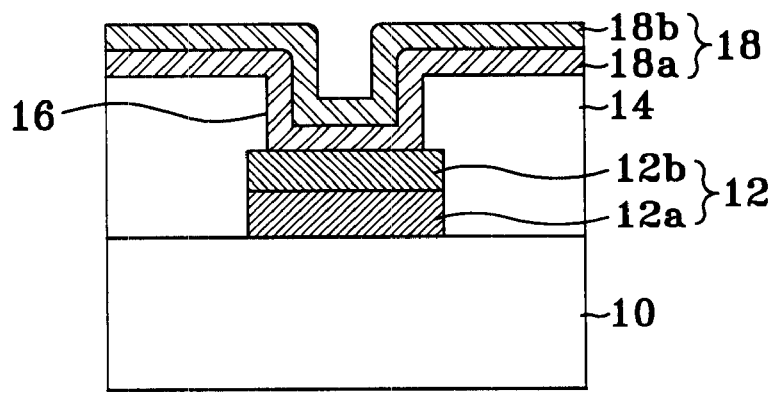
FIG. 1 shows cross sectional views of a conventional contact structure between a word line and a bit line in the periphery region of a memory device.
Figure 2:
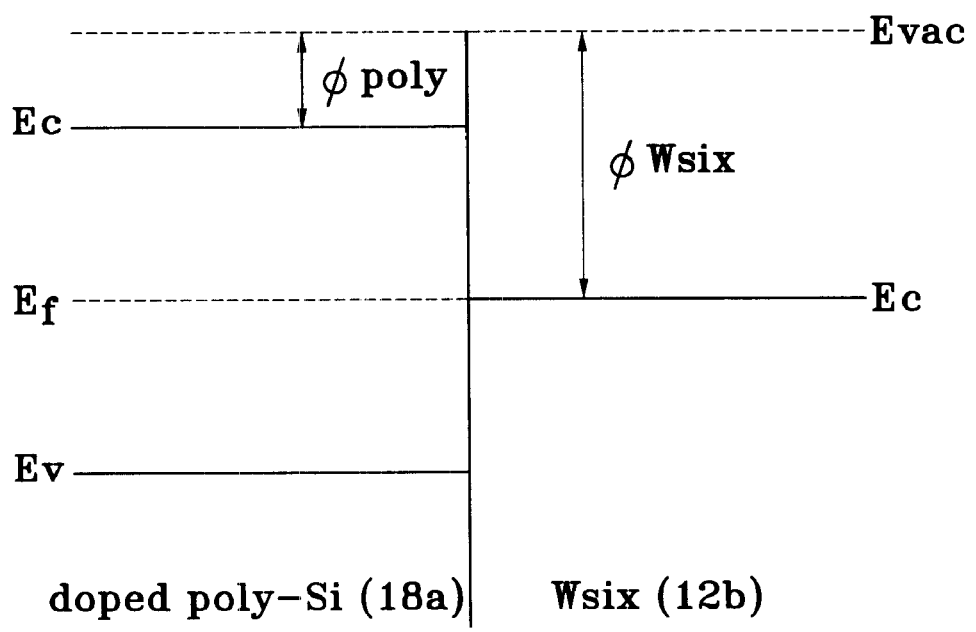
FIG. 2 shows a conventional energy band diagram for contact portion of a word line and a bit line.
Figure 3:
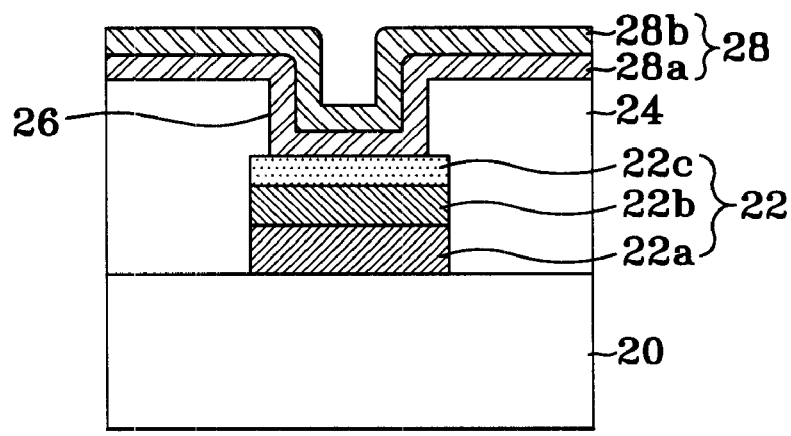
FIG. 3 shows cross sectional views of a contact structure between a word line and a bit line in the periphery region of a memory device, according to an embodiment of the present invention.
Figure 4:
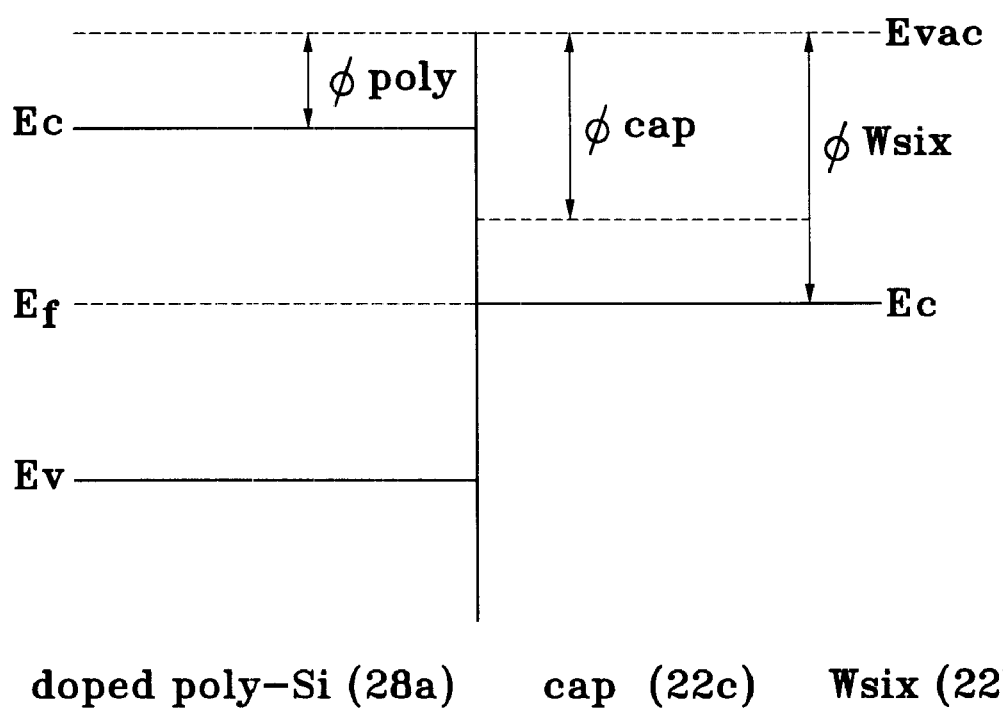
FIG. 4 shows an energy band diagram for contact portion of a word line and a bit line, according to an embodiment of the present invention.

FIG. 3 shows cross sectional views of a contact structure between a word line and a bit line in the periphery region of a memory device, according to an embodiment of the present invention. FIG. 4 shows an energy band diagram for contact portion of a word line and a bit line, according to an embodiment of the present invention.

Referring to FIG. 3, a word line 22 is formed on a semiconductor device and a bit line 28 is in contact with the word line 22 through a contact hole 26 formed in an intermediate insulating layer 24. The word line 22 includes a first doped polysilicon(poly-Si) layer 22a, a first tungsten silicide(WSix) layer 22b and a cap layer 23c which are formed on the substrate 20, sequentially. The bit line 28 includes a second doped polysilicon layer 28a and a second tungsten layer 28b formed sequentially.

Here, the cap layer 22c of the word line 22 is formed to a doped polysilicon containing a small amount of tungsten. The stoichiometrical equivalent ratio x of Si for the cap layer 22c is 2.6 to 2.9 while the stoichiometrical equivalent ratio x for Si of the first tungsten silicide layer 22b is 2.3 to 2.5. The cap layer 22c therefore has a work function between the second doped polysilicon layer 28a of the bit line 28 and the first tungsten silicide layer 22b. Preferably, the thickness of the first doped polysilicon layer 22a is 500 to 700 Å, the thickness of the first tungsten silicide 22b is 900 to 1,300 Å and the thickness of the cap layer 22c is 50 to 300 Å.

Accordingly, in the contact portion of the word line, 22 and the bit line 28, barrier height due to the difference of work functions $\phi$poly and $\phi$wsix decreases by the cap layer 22c having a work function $\phi$cap, as shown in FIG. 4. As a result, migration of electrons is activated and tunneling current increases.

Hereinafter, a method of forming contact between a word line and a bit line will be explained.

Referring to FIG. 3, a first doped polysilicon layer 22a and a first tungsten silicide (WSix) layer 22b are sequentially formed on a semiconductor substrate 20. Here, the first doped polysilicon layer 22a is formed by Chemical Vapor Deposition(CVD) using $SiH_4$ gas as reactive gas and using $PH_3$ gas as dopant at the temperature of 500 to 700° C. Preferably, the ratio of $SiH_4$: $PH_3$ is 1.1:1.5 to 1.5:1.8. The first doped polysilicon layer 22a is formed to the thickness of 500 to 700 Å. The first tungsten silicide layer 22b is formed by CVD using $SiH_2Cl_2$ (or $SiH_4$) gas and $WF_6$ gas as reactive gases at the temperature of 550 to 600° C. Preferably, the ratio of $SiH_2Cl_2$ (or $SiH_4$):$WF_6$ is 8:1.5 to 10:2 and the stoichiometrical equivalent ratio x for Si of the first tungsten silicide layer 22b is 2.3 to 2.5. For, example, when x is 2.3 to 2.5, adhesion of the first tungsten silicide layer 22b for the first doped polysilicon layer 22a is good. The tungsten silicide layer 22b is formed to the thickness of 900 to 1,300 Å.

Next, an undoped polysilicon layer is deposited by in-situ using $SiH_2Cl_2$ (or $SiH_4$) gas and $WF_6$ gas used for forming the first tungsten silicide layer 22b, to form a cap layer 22c. Preferably, by controlling the ratio of $SiH_2Cl_2$ (or $SiH_4$): $WF_6$ to 9:0.8 to 11:1.2, the amount of Si increases while the amount of W decreases. The cap layer 22c is formed as an the undoped polysilicon layer containing a small amount of W. Preferably, stoichiometrical equivalent ratio x for Si of the cap layer 22c is 2.6 to 2.9. The cap layer 22c is formed to the thickness of 50 to 300 Å.

Next, a second doped polysilicon layer 28a and a second tungsten silicide layer 28b are sequentially formed on the surface of the contact hole 26 and on the intermediate insulating layer 24 and patterned, to a bit line 28 being in contact with the word line 22. Here, the second doped polysilicon layer 28a and the second tungsten silicide layer are formed under the same condition as the first doped polysilicon layer 22a and the first tungsten silicide layer 22b. That is, the second doped polysilicon layer 28a is formed by CVD using $SiH_4$ gas as reactive gas and using $PH_3$ gas as dopant at the temperature of 500 to 700° C. The second tungsten silicide layer 28b is formed by CVD using $SiH_2Cl_2$ gas and $WF_6$ gas at the temperature of 550 to 600° C.

Thereafter, the substrate in which the bit line 28 is formed is annealed at the temperature of 600 to 900° C., for the purpose of transforming the lattice structure of the first and second tungsten silicide layers 22b and 28b into a square lattice structure and stabilizing them. At this time, impurities of the second doped polysilicon layer 28a are outdiffused into the cap layer 22c, so that the cap layer 22c are doped to has conductivity.

According to the present invention, in the contact portion of a word line and a bit line, barrier height due to the difference of work functions decreases by a cap layer formed on the tungsten silicide layer of the word line. As a result, migration of electrons is activated and tunneling current increases.

Furthermore, since the cap layer contains a small amount of W and most portions of it is formed to Si—Si bonding, the surface of the cap layer exposed after etching is substantially smooth. Moreover, the amount of W involved to reaction is small, thereby minimizing creation of the insulating compounds.

Accordingly, contact resistance between the word line and the bit line is reduced, thereby decreasing signal delay time. For example, in case contact size is 0.25 to 0.30 μm, contact resistance of the present invention is 600 to 800 w while that of the prior art is 1.4 to 1.8 KO.

Furthermore, contact structure above described can be applied to a contact between interconnection lines.

Although the preferred embodiment of this invention has been disclosed for illustrative purpose, those skilled in the art will appreciate that various modifications, additions and substitutions are possible, without from the scope and spirit of the invention as described in the accompanying claims.

What is claimed is:

1. A method of manufacturing a semiconductor device, comprising the steps of:

forming a first doped polysilicon layer and a first tungsten silicide layer on a semiconductor substrate, sequentially;

forming a cap layer on the first tungsten silicide layer, the cap layer being formed of an undoped polysilicon layer containing a predetermined amount of tungsten and having stoichiometrical equivalent ratio x of Si higher than the first tungsten silicide layer, wherein the cap layer is formed in-situ immediately after forming the first tungsten silicide layer;

patterning the cap layer, the first tungsten silicide layer and the first doped polysilicon layer to form a lower conductor pattern;

forming an intermediate insulating layer on the overall substrate;

etching the intermediate insulating layer to expose a portion of the surface to the cap layer, thereby forming a contact hole;

forming a second doped polysilicon layer and a second tungsten silicide layer on the surface of the contact hole and on the intermediate insulating layer, sequentially;

patterning the second tungsten silicide layer and the second doped polysilicon layer to form an upper conductor pattern being in contact with the lower conductor pattern; and annealing the substrate in which the upper conductor pattern is formed to transform the lattice structure of the first and second tungsten silicide layers into a square lattice structure and stabilizing them and to outdiffuse impurities of the second doped polysilicon layerinto the cap layer, thereby doping the cap layer.

2. The method according to claim 1, wherein the first tungsten silicide layer is formed by CVD using $SiH_2Cl_2$ (or $SiH_4$) gas and $WF_6$ gas as reactive gases at the temperature of 550 to 600° C.

3. The method according to claim 2, wherein the ratio of $SiH_2Cl_2$ (or $SiH_4$): $WF_6$ is 8:1.5 to 10:2.

4. The method according to claim 3, wherein the stoichiometrical equivalent ratio x for Si of the first tungsten silicide layer is 2.3 to 2.5.

5. The method according to claim 1, wherein the cap layer is formed by depositing a undoped polysilicon layer by in-situ after forming the first tungsten silicide layer using $SiH_2Cl_2$ (or $SiH_4$) gas and $WF_6$.

6. The method according to claim 5, wherein the ratio of $SiH_2Cl_2$ (or $SiH_4$): $WF_6$ to 9:0.8 to 11:1.2.

7. The method according to claim 6, the stoichiometrical equivalent ratio x for Si of the cap layer is 2.6 to 2.9.

8. The method according to claim 1, wherein the annealing is preformed at the temperature of 600 to 900° C.

9. The method according to claim 1, wherein the first doped polysilicon layer is formed to the thickness of 500 to 700 Å.

10. The method according to claim 9, wherein the first is formed to the thickness of 50 to 300 Å.

11. The method according to claim 10, wherein the cap layer is formed to the thickness of 50 to 300 Å.

12. The method according to claim 1, wherein the lower conductor pattern is a word line and the upper conductor pattern is a bit line.

* * * * *